(12) United States Patent
Ota

(10) Patent No.: US 9,520,313 B2
(45) Date of Patent: Dec. 13, 2016

(54) CONVEYANCE SYSTEM AND TEMPORARY STORAGE METHOD OF ARTICLES IN CONVEYANCE SYSTEM

(71) Applicant: Murata Machinery, Ltd., Kyoto-shi, Kyoto (JP)

(72) Inventor: Tatsuji Ota, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 65 days.

(21) Appl. No.: 14/404,661

(22) PCT Filed: Apr. 22, 2013

(86) PCT No.: PCT/JP2013/061746
§ 371 (c)(1),
(2) Date: Dec. 1, 2014

(87) PCT Pub. No.: WO2013/183376
PCT Pub. Date: Dec. 12, 2013

(65) Prior Publication Data
US 2015/0110585 A1  Apr. 23, 2015

(30) Foreign Application Priority Data

Jun. 8, 2012  (JP) ................................ 2012-130513

(51) Int. Cl.
| H01L 21/67 | (2006.01) |
| H01L 21/677 | (2006.01) |
| B65G 1/04 | (2006.01) |

(52) U.S. Cl.
CPC ....... H01L 21/67766 (2013.01); B65G 1/0457 (2013.01); H01L 21/67733 (2013.01); H01L 21/67769 (2013.01)

(58) Field of Classification Search
CPC ................... H01L 21/67733; H01L 21/67766; H01L 21/67769; B65G 1/0457
(Continued)

(56) References Cited

U.S. PATENT DOCUMENTS 4,459,078 A * 7/1984 Chiantella ............ B65G 1/0414
414/279
9,263,311 B2 * 2/2016 Ota ....................... B65G 1/0457
(Continued)

FOREIGN PATENT DOCUMENTS

| EP | 2 450 296 A1 | 5/2012 |
| EP | 2 450 297 A1 | 5/2012 |

(Continued)

OTHER PUBLICATIONS

Official Communication issued in International Patent Application No. PCT/JP2013/061746, mailed on Jul. 30, 2013.

*Primary Examiner* — Gerald McClain
*Assistant Examiner* — Ronald Jarrett
(74) *Attorney, Agent, or Firm* — Keating & Bennett, LLP

(57) ABSTRACT

In a transport system, a track for a local carriage is provided directly below a track for overhead traveling vehicles, and the overhead traveling vehicles and the local carriage both transfer an article to and from the same transfer destination. A buffer is connected to the track for the transport local carriage to deliver and receive the article to and from the local carriage and includes a transport in/out cell below the track for the overhead traveling vehicles to deliver and receive the article to and from the overhead traveling vehicles, the buffer being provided in a location not directly below the track of the local carriage.

7 Claims, 7 Drawing Sheets

(58) Field of Classification Search
USPC .......................................................... 414/281
See application file for complete search history.

(56) References Cited

U.S. PATENT DOCUMENTS

| | | |
|---|---|---|
| 2009/0065460 A1 | 3/2009 | Murata et al. |
| 2009/0238664 A1* | 9/2009 | Murata .................. B65G 37/02 |
| | | 414/222.02 |
| 2011/0031091 A1 | 2/2011 | Fatula, Jr. et al. |
| 2012/0093620 A1* | 4/2012 | Murata ............. H01L 21/67769 |
| | | 414/281 |
| 2013/0142597 A1 | 6/2013 | Kinugawa et al. |

FOREIGN PATENT DOCUMENTS

| | | |
|---|---|---|
| JP | 09-315521 A | 12/1997 |
| JP | 2009-154983 A | 7/2009 |
| JP | 2009-173396 A | 8/2009 |

* cited by examiner

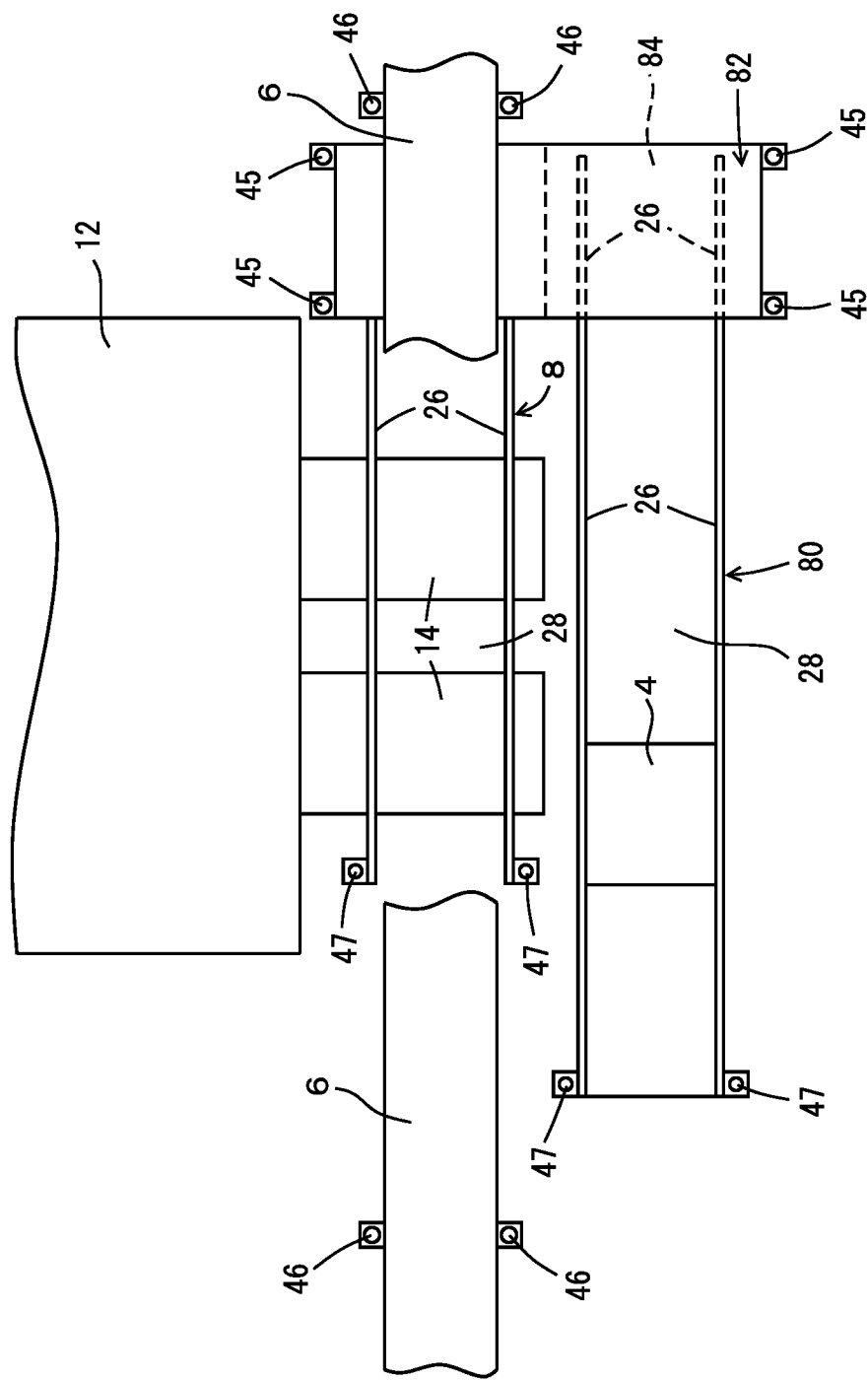

CONVEYANCE SYSTEM AND TEMPORARY STORAGE METHOD OF ARTICLES IN CONVEYANCE SYSTEM

BACKGROUND OF THE INVENTION

1. Field of the Invention

The present invention relates to a transport system and a method for temporarily storing articles in the transport system, and in particular relates to temporary storage of articles in the transport system that includes an overhead traveling vehicle, a local carriage, a buffer, and a load port.

2. Description of the Related Art

The inventor has proposed a transport system according to which a track for a local carriage is arranged directly below a travel rail for an overhead traveling vehicle and directly above a load port, and a buffer is arranged directly below the track for the local carriage and not in an area directly above the load port (See, for example, EP 2450297A). With this system, the local carriage transports articles to and from the load port, and therefore articles are transported to and from the load port without waiting for the overhead traveling vehicle to arrive. Also, for example, the overhead traveling vehicle transports articles to and from the buffer, and the local carriage transports articles between the buffer and the load port. JP 2011-207621A also proposes a similar system.

Another conventional technique relating to temporary storage of articles will be described next. US 2011/31091A discloses a buffer in which the cells of shelves are aligned vertically and a dolly carriage provided in an elevator is allowed to go into and out of the cells. The buffer is arranged in the vicinity of a load port and multiple articles are stored therein so that the overhead traveling vehicle may transport articles thereto and therefrom. By doing so, articles needed by a processing equipment are transported to the buffer in advance. JP 2009-62153A discloses that an elevatable rail is provided in the buffer and a carriage including a fork is allowed to travel along the rail. With this buffer, the cells of the shelves are arranged vertically, and articles are transported to and from the shelves by means of the vertical movement of the rail and the traveling of the carriage. JP 2009-62153A also discloses that the buffer is connected to the overhead traveling vehicle system and is arranged in the vicinity of the load port.

However, if the capacity of the buffer in the system disclosed in EP 2450297A is increased, the track for the local carriage increases in length. For this reason, there is a limitation to the capacity of the buffer. With regard to this point, JP 2011-207621A proposes a buffer that moves articles laterally from the overhead traveling vehicle so as to transport them. However, in order to make it possible for the local carriage to access the buffer, a mechanism for moving articles laterally to the local carriage is needed. On the other hand, the buffers disclosed in US 2011/31091A and JP 2009-62153A are not configured to be connected to a local carriage.

SUMMARY OF THE INVENTION

Preferred embodiments of the present invention increase buffer capacity in a transport system in which a track for a local carriage is provided directly below a track for an overhead traveling vehicle.

In addition, preferred embodiments of the present invention prevent a conflict between transport of articles from the overhead traveling vehicles to the buffer and transport of articles between the load port and the buffer by a local carriage.

In a transport system according to a preferred embodiment of the present invention, overhead traveling vehicles and a local carriage both transfer articles to and from the same transfer destination, and the transport system includes a track for the overhead traveling vehicles; a track for the local carriage that is located directly below the track for the overhead traveling vehicles; a transfer destination located directly below both the track for the overhead traveling vehicles and the track for the local carriage; overhead traveling vehicles configured to travel on the track for the overhead traveling vehicles and include an elevating platform configured to move vertically while supporting an article; and a local carriage configured to travel on the track for the local carriage and includes an elevating platform configured to move vertically while supporting an article; and a buffer provided in a location that is not directly below the track for the local carriage, the buffer being connected to the track for the local carriage and being configured to deliver and receive the articles to and from the local carriage, wherein the buffer includes a plurality of cells configured to accommodate an article; a transport in/out cell for the overhead traveling vehicles to transport articles to and from, the transport in/out cell being provided below the track for the overhead traveling vehicles; and a transport apparatus configured to transport an article between cells.

With a method for temporarily storing an article in a transport system according to another preferred embodiment of the present invention, for a transport system that includes a track for overhead traveling vehicles; a track for a local carriage that is located directly below the track for the overhead traveling vehicles; a transfer destination located directly below both the track for the overhead traveling vehicles and the track for the local carriage; overhead traveling vehicles configured to travel on the track for the overhead traveling vehicles and include an elevating platform configured to move vertically while supporting an article; and a local carriage configured to travel on the track for the local carriage and include an elevating platform configured to move vertically while supporting an article, in which the overhead traveling vehicles and the local carriage both transport articles to the transfer destination in common, a buffer is provided at a location that is not directly below the track for the local carriage, the buffer being connected to the track for the local carriage and delivering and receiving articles to and from the local carriage, and including a plurality of cells and a transport apparatus configured to transport articles in the buffer; the overhead traveling vehicles transport articles to and from an article transport in/out cell in the buffer; the transport apparatus in the buffer transports articles between cells in the buffer; and the local carriage transports articles between cells in the buffer and the transfer destination.

With various preferred embodiments of the present invention, a buffer is provided at a location that is not directly below the track for the local carriage and the capacity of the buffer is increased. The buffer is connected to the track for the local carriage so that it may deliver and receive articles to and from the local carriage, and includes a transport in/out cell below the track for the overhead traveling vehicles so that it may deliver and receive articles to and from the overhead traveling vehicles as well. In view of this, articles are moved on the route traveled by the overhead traveling vehicles, the buffer, and the local carriage, in that order, in which the buffer is between the overhead traveling vehicles and the local carriage. Note that in the present specification, description regarding the transport system applies directly to the method for temporarily storing articles in the transport system as well.

Preferably, the transfer destination is a load port of a processing equipment configured to process the articles, and the track for the local carriage enters the buffer. The processing equipment is, for example, a machining apparatus or an examining apparatus for a semiconductor. Thus, the overhead traveling vehicles and the local carriage both transfer articles between load ports and multiple articles are accommodated in the buffer. Also, the local carriage enters the buffer and moves articles between the buffer and the load port.

Preferably, the plurality of cells are aligned in the buffer along an up-down direction and a horizontal direction, and include rails configured to be traveled on by the local carriage, and the track for the local carriage further enters one of the cells, the buffer includes an elevator that includes a rail configured to be traveled on by the local carriage, the local carriage is configured to move between cells via the elevator, and the transport apparatus includes the rails of cells, the elevator, and the local carriage. Thus, the local carriage enters the cells in the buffer via the elevator and transports the articles thereto and therefrom. Also, since cells are configured to be arranged vertically and horizontally for example, a buffer with a large capacity is obtained.

Also preferably, the plurality of cells are aligned in the buffer along an up-down direction and a horizontal direction, the track for the local carriage further enters one of the cells, the buffer includes a horizontal guide that moves vertically along a guide in the vertical direction and a fork that moves along the horizontal guide, and the transport apparatus includes the horizontal guide and the fork. Articles are transported between cells by the fork moving in the up-down direction and the horizontal direction, and articles are moved between the local carriage and the cells by allowing the track for the local carriage to enter one of the cells.

More preferably, the cell into which the track for the local carriage enters is located below the transport in/out cell. Accordingly, transport of the articles by the overhead traveling vehicles and transport of the articles to the load port by the local carriage are no longer in conflict with each other.

Also preferably, the track for the local carriage is a first track, the buffer includes a second track for the local carriage that is arranged parallel or substantially parallel to the first track and cells provided directly below the second track, and a shifter configured to move the local carriage between the first track and the second track is further provided. Thus, a system is obtained which includes a buffer with a capacity that corresponds to the length of the second track.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a plan view of a transport system according to a third preferred embodiment of the present invention, shown with a track for an overhead traveling vehicle cut away.

DETAILED DESCRIPTION OF THE PREFERRED EMBODIMENTS

Hereinafter, preferred embodiments of the present invention will be described. The scope of the present invention is based on the claims and is intended to be determined in accordance with the understanding of a person skilled in the art with reference to the description of the present invention and related art in the field of the present invention.

Figure 1:
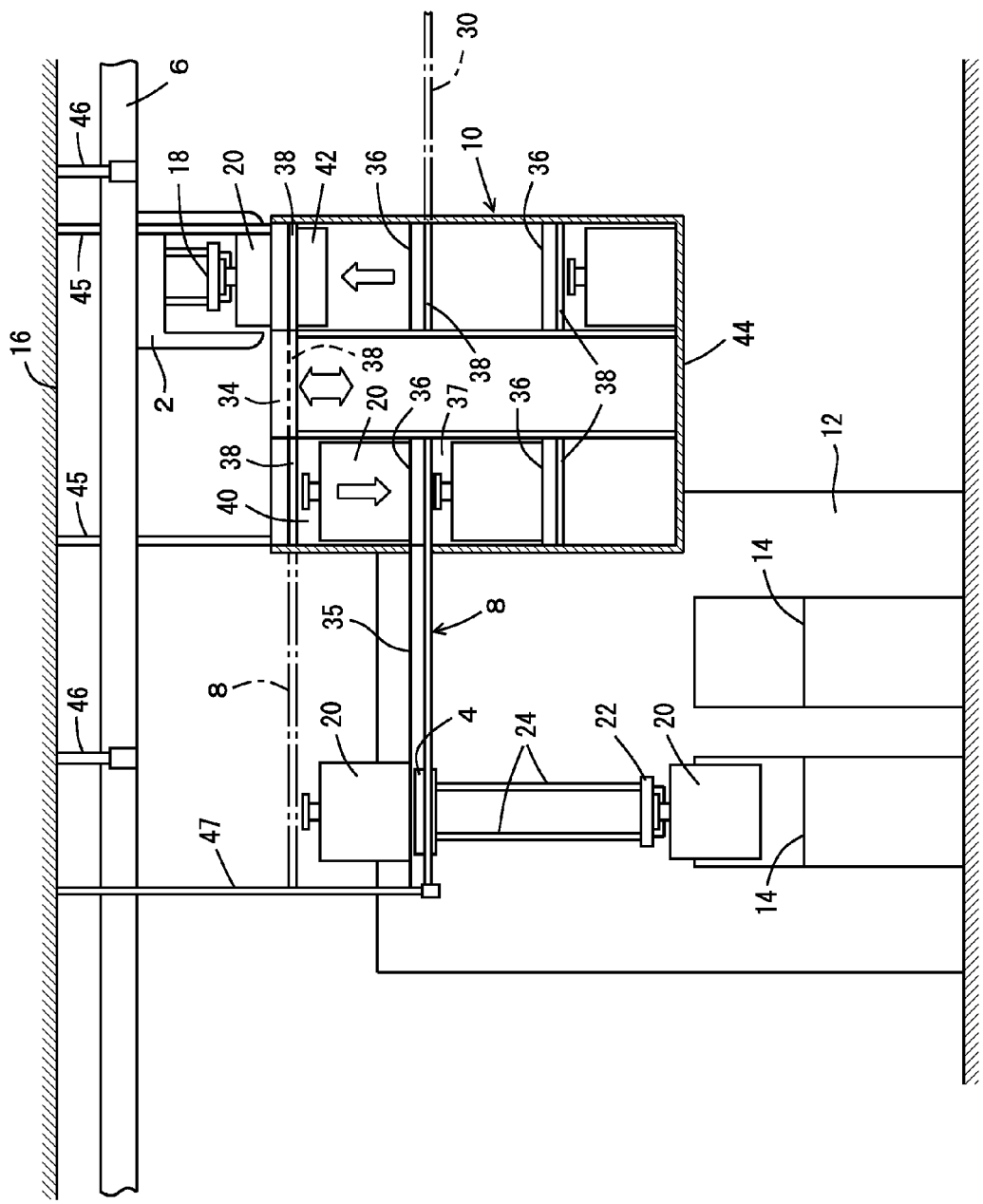
FIG. 1 is a side view of a transport system according to a preferred embodiment of the present invention, shown with a container for a buffer cut away.
Figure 2:
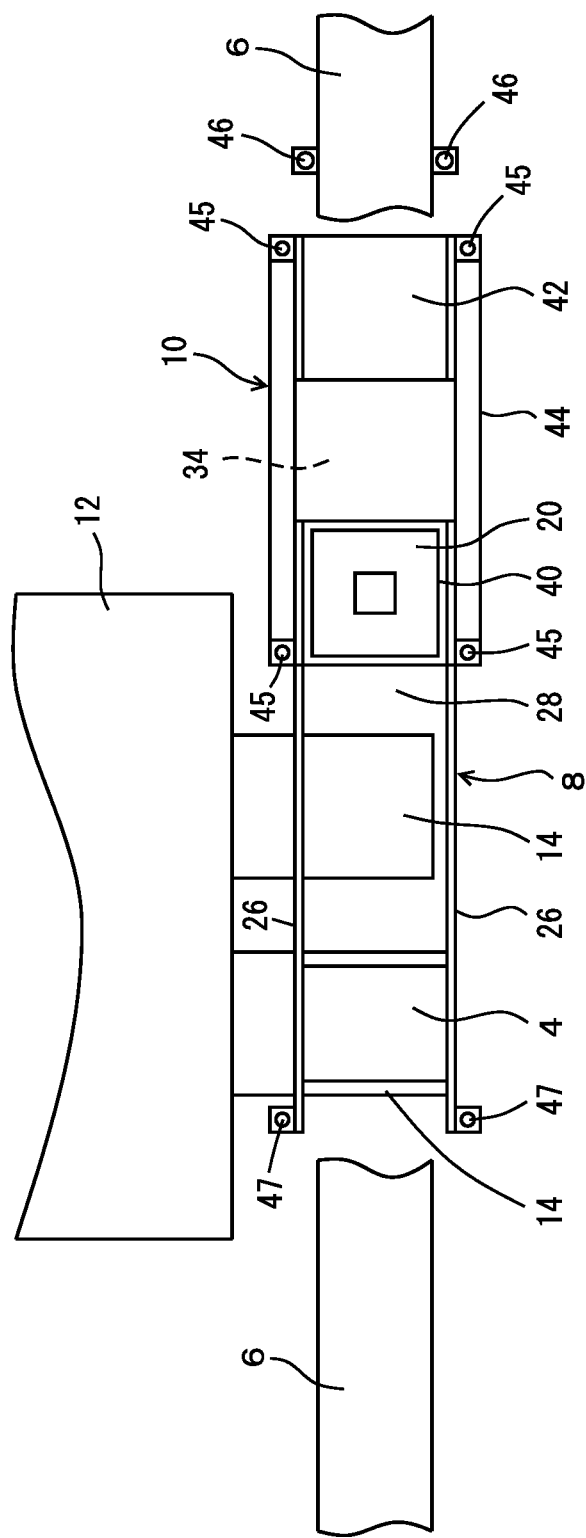
FIG. 2 is a plan view of a transport system according to a preferred embodiment of the present invention, shown with a track for an overhead traveling vehicle removed and with a buffer on a track for a local carriage cut away.

FIGS. 1 to 7 show preferred embodiments and modified examples of a transport system, and FIGS. 1 and 2 show a first preferred embodiment of the present invention. In the drawings, an overhead traveling vehicle 2 transports an article 20 such as an FOUP in a semiconductor factory, for example, and a local carriage 4 supplies and transports the article 20 to and from one or more processing equipment 12. Reference numeral 6 denotes a track for an overhead traveling vehicle that includes a traveling rail and a power supply rail, and reference numeral 8 denotes a track for the local carriage 4 that includes a pair of rails 26 and 26 shown in FIG. 2 and the like. Also, the processing equipment 12 includes one or more load ports 14. Reference numeral 16 denotes a ceiling of a cleaning room or the like, and the tracks 6 and 8 and the buffer 10 are supported by support pillars 45 to 47. The track 6 for the overhead traveling vehicle is at the highest location, the track 8 for the local carriage is located directly beneath it, and the load port 14 is directly below the tracks 6 and 8.

It is assumed herein that examples of the processing equipment 12 include examination apparatuses as well as machining apparatuses. The load ports 14 are provided on the front surface of the processing equipment 12, and the overhead traveling vehicle 2, the local carriage 4, and a person moving on the ground deliver and receive the article 20 to and from the load ports 14. In addition to the load ports 14, a display, an operation panel, and the like (not shown) are provided on the front surface of the processing equipment 12 such that the operation status of the processing equipment 12 is monitored and the processing equipment 12 is manually controlled. Also, the overhead traveling vehicle 2 and the local carriage 4 transfer the article 20 by raising and lowering the elevating platforms 18 and 22 that chuck the head portion of the article 20, using a suspending material 24.

The track 8 for the local carriage may be a monorail, but preferably includes the pair of rails 26 and 26. A gap 28 between the rails 26 and 26 is wider than the depth of the article 20, and together with the elevating platform 18 of the overhead traveling vehicle 2, the article 20 may pass through the gap 28 between the rails 26 and 26 in the vertical direction. For these reasons, even if the tracks 6 and 8 and the load ports 14 are arranged so as to overlap each other along the vertical direction, the overhead traveling vehicle 2 delivers and receives articles to and from the load port 14 and the buffer 10.

The buffer 10 includes an elevator 34 and shelf supports 36. Reference number 38 denotes a rail configured to move the local carriage 4 within the buffer 10. The rail is provided in the elevator 34 and the shelf support 36. The local carriage 4 is moved vertically within the buffer 10 by the elevator 34 and travels along the rail 38 so as to move between the shelf supports 36 and the elevator 34. The local carriage 4 moves the elevating platform 22 vertically so as to transfer the article 20 between the shelf supports 36. Also, the local carriage 4 travels between the area directly above the load ports 14 and the shelf supports 36 within the buffer 10. The overhead traveling vehicle 2 transports the article 20 to a transport-in cell 40 and transports the article 20 from a transport-out cell 42. The wide arrow in FIG. 1 indicates the raising and lowering direction of the elevator 34, and the thin arrows indicate the directions in which the article 20 is transported between the elevator 34 and the overhead traveling vehicle 2. Also, reference numeral 44 denotes a container for the buffer 10. The shelf supports 36 are aligned vertically and horizontally in the buffer 10, and therefore the buffer 10 has a large capacity.

The track 8 extends to, for example, the cells 37 on the second level from the top of the buffer 10 thereof, and more generally, to the cells that are not on the uppermost level. Due to the track 8 being connected to cells other than the transport-in cell 40 and the transport-out cell 42, transport of the article 20 by the overhead traveling vehicle 2 and transport of the article 20 to and from the load port by the local carriage 4 no longer conflict with each other. Accordingly, one level's-worth of empty space for the article 20 is generated in the area above the track 8, and the overhead traveling vehicle 2 is configured to use this space as a buffer 35. Note that if the buffer 10 is shared by multiple processing equipment, a track 30 indicated by the chain line in FIG. 1 preferably is provided. Also, if it is desired that the difference in height between the load port 14 and the track 8 is made bigger, the track 8 is connected to the transport-in cell 40. When the track 8 is connected to the transport-out cell 42, if the local carriage 4 is to travel to the area above the load port 14, an article prepared for transport is first transported from the transport-out cell 42, and then the local carriage 4 travels to the area above the load port 14. In contrast to this, when the track 8 is connected to the transport-in cell 40, this kind of labor is not needed.

Figure 3:
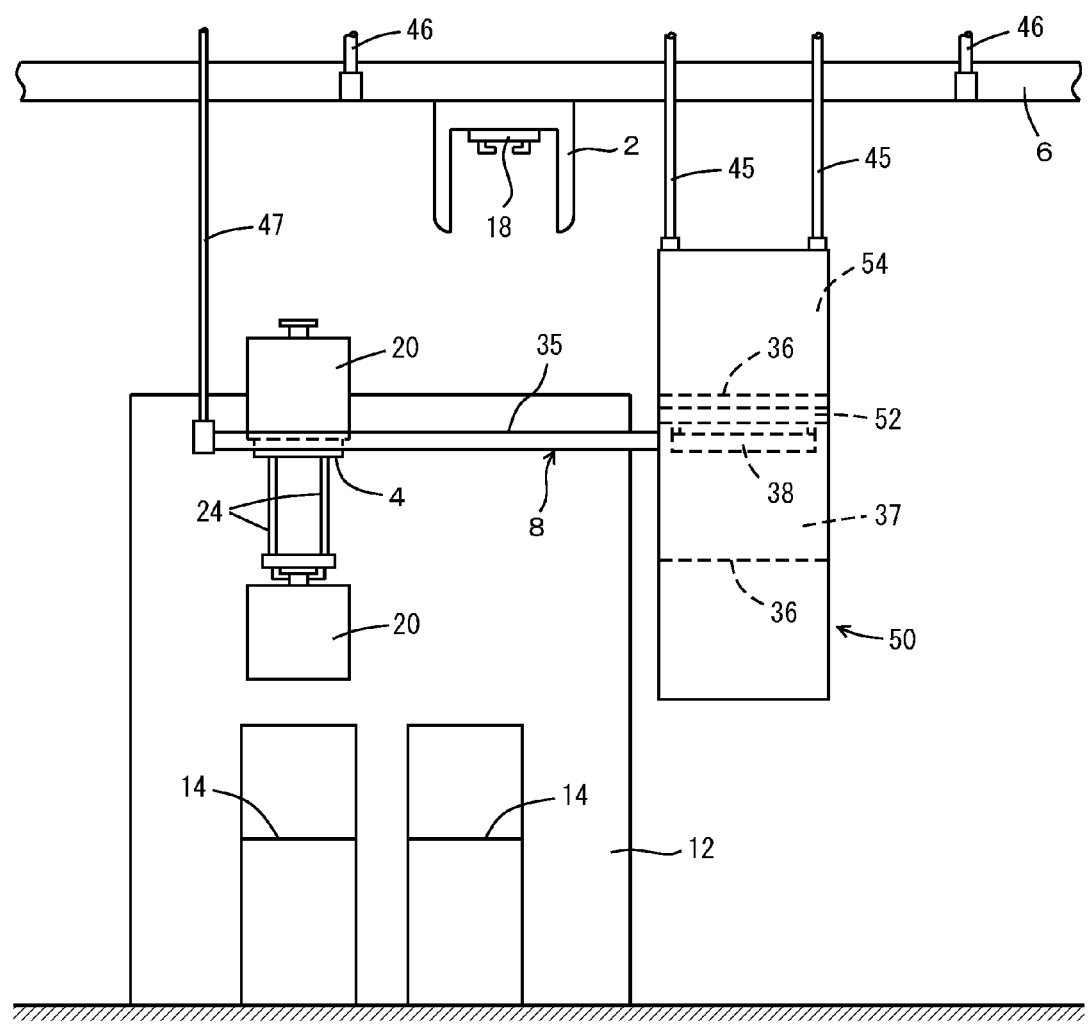
FIG. 3 is a side view of a transport system according to a modified example of a preferred embodiment of the present invention.
Figure 4:
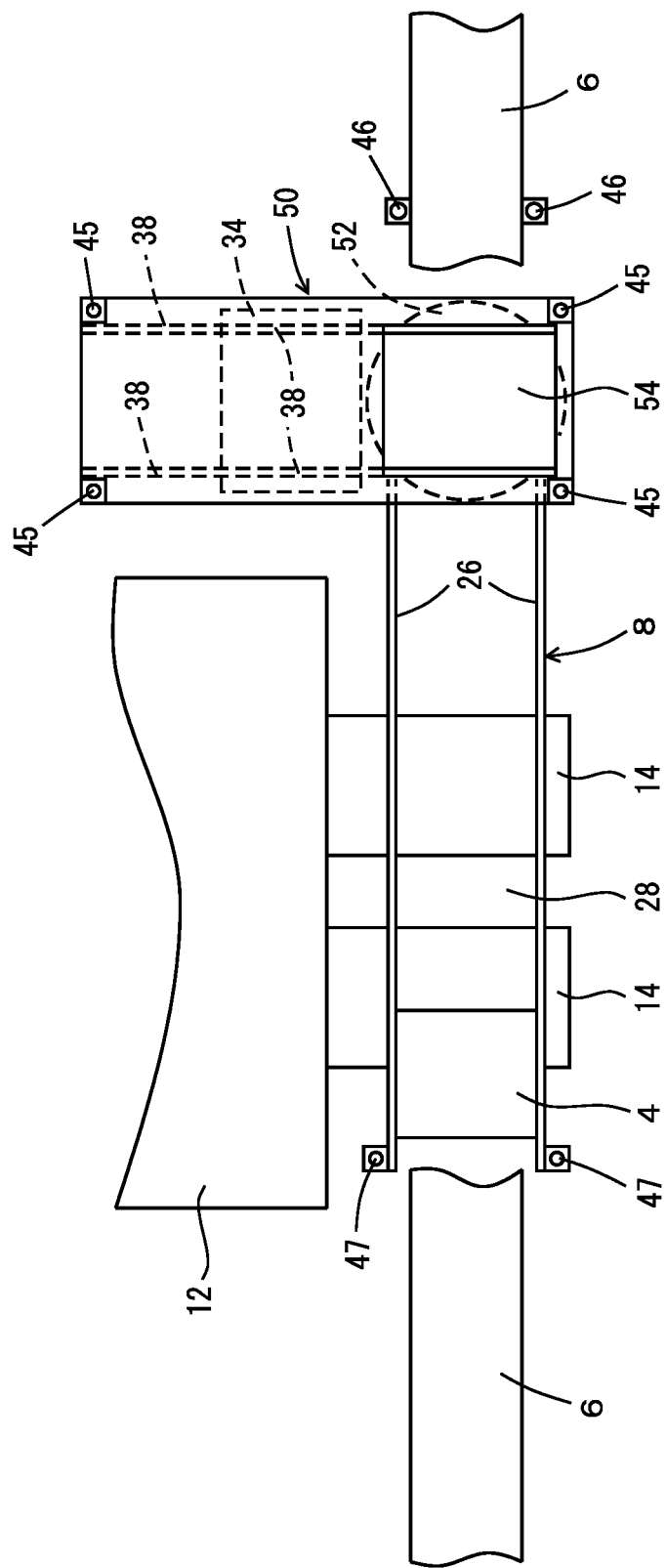
FIG. 4 is a plan view of a transport system according to a modified example of a preferred embodiment of the present invention, shown with a track for an overhead traveling vehicle cut away.

With the preferred embodiments described with reference to FIGS. 1 and 2, the direction in which the local carriage 4 travels within the buffer 10 and the direction of the track 8 (longitudinal direction of the buffer 10) are parallel or substantially parallel, for example. In contrast to this, a buffer 50 according to a modified example in which these elements are made to intersect each other at a right angle is indicated in FIGS. 3 and 4, and the buffer 50 is appropriate for installation in a gap between processing equipment, or the like. The buffer 50 according to the modified example is similar to the buffer 10 in FIGS. 1 and 2, with the exception of portions that will be specifically indicated below. The direction in which the local carriage 4 travels changes by 90° between the interior and exterior of the buffer 50. In view of this, a turntable 52 is provided in the cell 37 on the second level from the top that is connected to the track 8. The turntable 52 supports the rail 38 and rotates the rail 38 inside of the cell 37 by 90°. Also, since one cell overlaps up-and-down with the track 6 for the overhead traveling vehicle 2, the overhead traveling vehicle 2 transports articles to and from a transport in/out cell 54.

Figure 5:
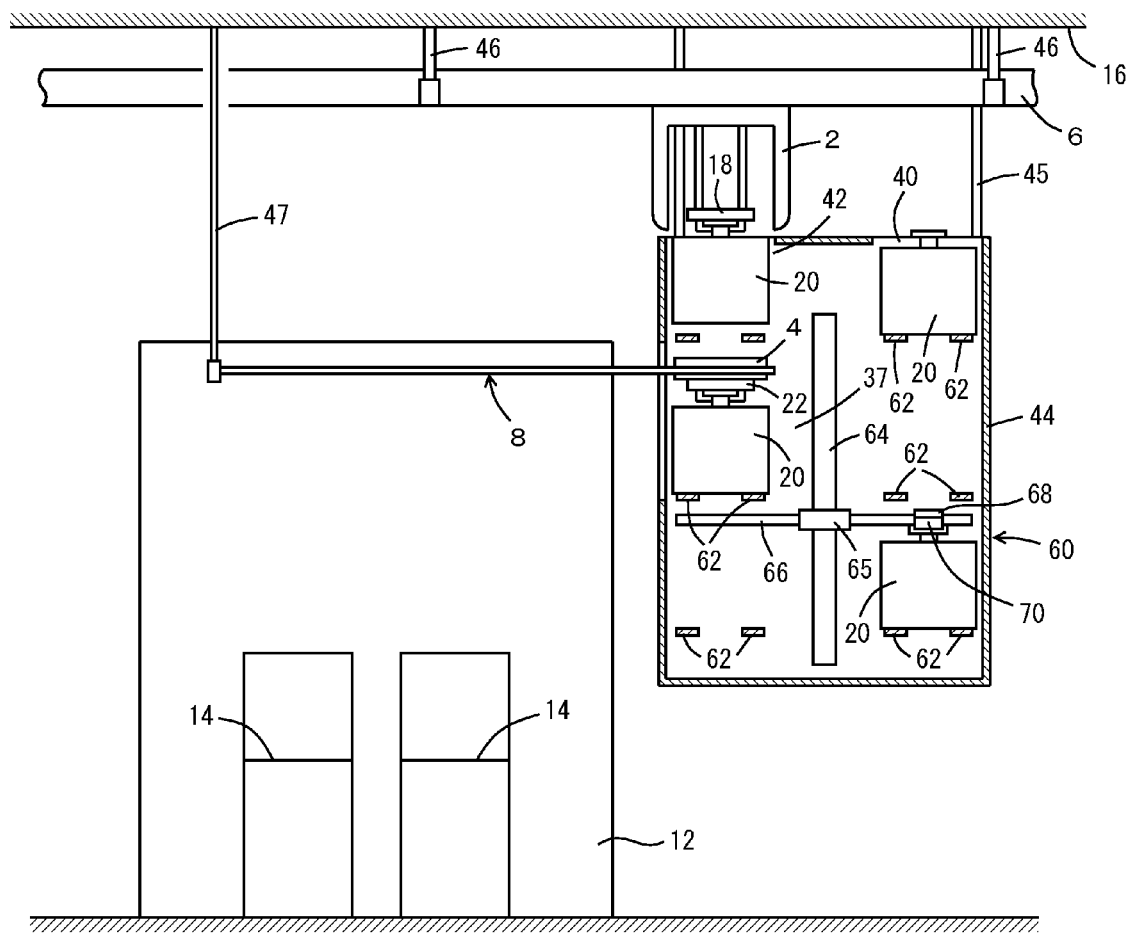
FIG. 5 is a side view of a transport system according to a second preferred embodiment of the present invention, shown with a partially cut out portion added and the container for the buffer cut away.

FIG. 5 shows a second preferred embodiment of the present invention. Reference numeral 60 denotes a new buffer, in which shelf supports 62 are aligned in the up-down direction and in the left-right direction, for example, so as to support the article 20. In the buffer 60, there is an empty space in which no shelf support 62 is present, and in this space, an elevation guide 64 is provided, and an elevating member 65 to which a horizontal guide 66 is attached moves vertically. A moving portion 68 provided with a fork 70 moves along the horizontal guide 66. The moving portion 68 moves up, down, left, and right as a whole, and by moving the fork 70 vertically together with the moving portion 68, the article 20 may be transferred between any of the shelf supports 62.

The elevation guide 64, the horizontal guide 66, and the like are arranged on the far side and the shelf supports 62 are arranged on the near side along the direction perpendicular or substantially perpendicular to the sheet surface of FIG. 5. Also, when the moving portion 68 is returned to the elevating member 65 side, the fork 70 is capable of moving vertically without interfering with the article 20 on the shelf support 62. Also, the upper surface of the fork 70 is made to be lower than the bottom surface of the shelf support 62 so that when the fork 70 is moved horizontally, the fork 70 is capable of being positioned in an area below the desired shelf support 62. Also, by raising the fork 70, the article 20 is loaded from the shelf support 62 onto the fork 70. Then, by returning the fork 70 to the vicinity of the elevation guide 64 and moving the elevating member 65 vertically, the fork 70 is capable of being moved to a desired height. When unloading an article onto a shelf support 62, the bottom surface of the fork 70 is made to be higher than the upper surface of the shelf support 62 and the fork is moved to the area above the shelf support 62. Then, when the fork 70 is lowered, the article 20 may be unloaded onto the shelf support 62. The return from this point is similar to that in case of loading. A local carriage may not be used as the moving portion 68, and therefore the track 8 extends to, for example, the cell 37 in the second level from the top and the article 20 is exchanged between the moving portion 68 and local carriage 4 via the cell 37.

Figure 6:
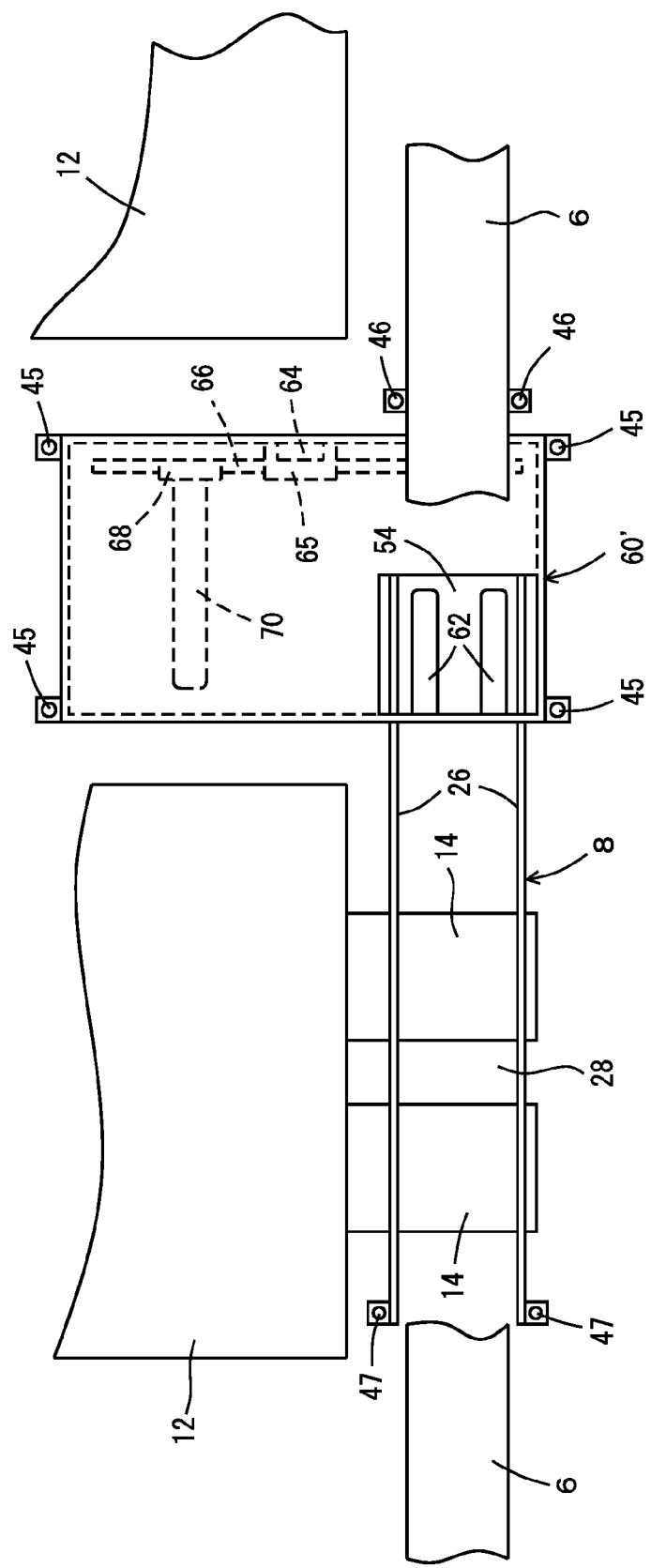
FIG. 6 is a plan view of a transport system according to a second modified example of a preferred embodiment of the present invention, shown with a track for an overhead traveling vehicle cut away.

FIG. 6 shows a second modified example that is similar to the preferred embodiment described with reference to FIG. 5, with the exception of portions that will be specifically indicated below. A buffer 60' is arranged in a gap between processing equipment 12 and 12. Unlike the modified example described with reference to FIGS. 3 and 4, no turntable is needed in the buffer 60'. Multiple groups of shelf supports 62 are arranged in the vertical direction and the depth direction of the processing equipment 12 and 12 (the left-right direction in FIG. 6).

FIG. 7 shows a third preferred embodiment of the present invention that is similar to the preferred embodiment described with reference to FIGS. 1 and 2, with the exception of portions that will be specifically indicated below. A buffer 80 is arranged parallel or substantially parallel to and at the same height as the track 8 in the vicinity of the roof on a path of a cleaning room. The local carriage 4 travels on a rail 26 provided in the upper level of the buffer 80. The article 20 is supported by cells (not shown) that include shelf supports and are provided in the lower level of the buffer 80.

In order to connect the track 8 on the front surface of the processing equipment 12 and the buffer 80, a bridge 82 is provided. A shifter 84 in which the rail 26 is included moves in the bridge 82, between the track 8 side and the buffer 80 side. In the present preferred embodiment, a buffer directly below the track 8 and the buffer 80 preferably are included, and therefore the capacity of the buffers is increased. In particular, with the buffer 80, there is no location at which the buffer may not be installed for the load port 14, and therefore a large capacity is achieved.

The following advantageous effects are obtained with the preferred embodiments.

1) The capacity of the buffers is increased.

2) If the track 8 is connected to the cells 37 and the like, and not to the cells 40, 42, and 54 for transport by the overhead traveling vehicle 2, transport of articles by the overhead traveling vehicle 2 and transport to and from the load port by the local carriage 4 do not conflict with each other.

3) Note that conflicts between the overhead traveling vehicle 2 and the local carriage 4 are reduced also in the case where the track 8 is connected to the cell 40 for the transport of articles from an overhead traveling vehicle.

Regarding the transport of articles, an example was described in which preferably only a local carriage transports articles to the load port and the local carriage 4 and the overhead traveling vehicle 2 exchange articles via a buffer. However, the overhead traveling vehicle 2 and the local carriage 4 may both transport articles to and from the buffer and the load port. In such a case, in the area directly above the load port 14, the buffer 35 is not provided in the area above the track 8.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transport system in which overhead traveling vehicles and a local carriage both transfer articles to and from a same transfer destination, the transport system comprising:
    a track for the overhead traveling vehicles;
    a track for the local carriage that is located directly below the track for the overhead traveling vehicles;
    a transfer destination located directly below both the track for the overhead traveling vehicles and the track for the local carriage;
    overhead traveling vehicles configured to travel on the track for the overhead traveling vehicles and including an elevating platform configured to move vertically while supporting an article;
    a local carriage configured to travel on the track for the local carriage and including an elevating platform configured to move vertically while supporting an article; and
    a buffer being connected to the track for the local carriage and being configured to deliver and receive the articles to and from the local carriage; wherein
    the buffer includes:
        a plurality of cells configured to accommodate an article, the plurality of cells are aligned in the buffer along an up-down direction to define a plurality of columns of the buffer and along a horizontal direction to define a plurality of rows of the buffer;
        a transport in/out cell to which the overhead traveling vehicles transport articles to and from, the transport in/out cell being provided below the track for the overhead traveling vehicles, the transport in/out cell being provided in an uppermost row of the plurality of rows of the buffer; and
        a transport apparatus configured to transport an article between the plurality of cells;
    the track for the local carriage extends into one cell of the plurality of cells included in the buffer, or the track for the local carriage is directly connected to the one cell of the plurality of cells included in the buffer without extending into the buffer; and
    at least one column of the plurality of columns of the buffer is not directly below the track for the local carriage.

2. The transport system according to claim 1, wherein the transfer destination is a load port of a processing equipment configured to process the articles; and
    the track for the local carriage extends into the one cell of the plurality of cells.

3. The transport system according to claim 2, wherein the plurality of cells include first rails configured to be traveled on by the local carriage, and the track for the local carriage includes second rails;
    the buffer includes an elevator that includes a rail configured to be traveled on by the local carriage and the local carriage is configured to move between the plurality of cells via the elevator; and
    the transport apparatus includes the first rails, the elevator, and the local carriage.

4. The transport system according to claim 2, wherein the buffer includes a horizontal guide configured to move up and down along a vertical guide and a fork configured to move along the horizontal guide; and
    the transport apparatus includes the horizontal guide and the fork.

5. The transport system according to claim 3, wherein the one cell of the plurality of cells is located below the transport in/out cell.

6. The transport system according to claim 4, wherein the one cell of the plurality of cells is located below the transport in/out cell.

7. A method for temporarily storing articles in a transport system including a track for overhead traveling vehicles, a track for a local carriage that is located directly below the track for the overhead traveling vehicles,
    a transfer destination located directly below both the track for the overhead traveling vehicles and the track for the local carriage, overhead traveling vehicles configured to travel on the track for the overhead traveling vehicles and including an elevating platform configured to move vertically while supporting an article, and the local carriage configured to travel on the track for the local carriage and include an elevating platform configured to move vertically while supporting an article, wherein the overhead traveling vehicles and the local carriage both transport articles to the transfer destination in common, a buffer being connected to the track for the local carriage and delivering and receiving articles to and from the local carriage, the buffer including a plurality of cells aligned in the buffer along an up-down direction to define a plurality of columns of the buffer and along a horizontal direction to define a plurality of rows of the buffer, and a transport apparatus to transport articles in the buffer, the overhead traveling vehicles transport articles to and from an article transport in/out cell in the buffer, the transport in/out cell being provided in an uppermost row of the plurality of rows of the buffer, the transport apparatus in the buffer transports articles between the plurality of cells in the buffer, and the local carriage transports articles between the plurality of cells in the buffer and the transfer destination, the track for the local carriage extends into one cell of the plurality of cells included in the buffer, or the track for the local carriage is directly connected to the one cell of the plurality of cells included in the buffer without extending into the buffer, and at least one column of the plurality of columns of the buffer is not directly below the track for the local carriage.

* * * * *